(12) United States Patent
Kuksin et al.

(10) Patent No.: US 12,043,016 B2
(45) Date of Patent: Jul. 23, 2024

(54) METHODS AND SYSTEMS FOR ATTACHING DETECTORS TO ELECTRONIC READOUT SUBSTRATES

(71) Applicant: Rapiscan Systems, Inc., Torrance, CA (US)

(72) Inventors: Evgeniy Kuksin, Woodland Hills, CA (US); Neal Hartsough, Fullerton, CA (US); William C. Barber, Ventura, CA (US)

(73) Assignee: Rapiscan Systems, Inc., Torrance, CA (US)

( * ) Notice: Subject to any disclaimer, the term of this patent is extended or adjusted under 35 U.S.C. 154(b) by 1243 days.

(21) Appl. No.: 16/705,075

(22) Filed: Dec. 5, 2019

(65) Prior Publication Data

US 2021/0170734 A1 Jun. 10, 2021

(51) Int. Cl.
*B32B 37/12* (2006.01)
*B32B 3/26* (2006.01)
(Continued)

(52) U.S. Cl.
CPC .......... *B32B 37/1292* (2013.01); *B32B 3/266* (2013.01); *B32B 7/14* (2013.01); *B32B 37/1207* (2013.01); *B32B 37/18* (2013.01); *C09J 5/06* (2013.01); *C09J 7/35* (2018.01); *C09J 9/02* (2013.01); *C09J 163/00* (2013.01); *C09J 183/04* (2013.01); *H01L 24/29* (2013.01); *H01L 24/83* (2013.01); *H01L 27/1463* (2013.01); *H01L 27/14683* (2013.01); *B32B 2305/72* (2013.01); *B32B 2307/202* (2013.01); *B32B 2307/206* (2013.01); *B32B 2309/025* (2013.01); *B32B 2457/14* (2013.01); *C09J 2203/326* (2013.01); *C09J 2463/00* (2013.01);
(Continued)

(58) Field of Classification Search
CPC .......... B32B 7/1792; B32B 3/266; B32B 7/14
See application file for complete search history.

(56) References Cited

U.S. PATENT DOCUMENTS 6,133,070 A * 10/2000 Yagi .................... H01L 23/3107
438/111
6,553,829 B1 4/2003 Nakada
(Continued)

FOREIGN PATENT DOCUMENTS

DE 102008013412 B3 * 10/2009 ................ C09J 5/00

OTHER PUBLICATIONS

International Search Report for PCT/US2019/064777, Feb. 21, 2020.

*Primary Examiner* — Dah-Wei D. Yuan
*Assistant Examiner* — Kristen A Dagenais
(74) *Attorney, Agent, or Firm* — Novel IP

(57) ABSTRACT

A method of attaching a detector onto a substrate that has an array of electrically conducting pads is provided, together with the resulting detector assembly. The method includes pouring a non-conductive adhesive material over a substrate surface, allowing the adhesive to settle between the conducting pads to form dams around the conducting pads, applying a conductive adhesive material onto the conducting pads of the substrate, and placing a surface of the detector on the substrate surface over the conducting and non-conducting adhesives to thereby attach the surface of the detector to the surface of the substrate.

60 Claims, 5 Drawing Sheets

(51) Int. Cl.
*B32B 7/14* (2006.01)
*B32B 37/18* (2006.01)
*C09J 5/06* (2006.01)
*C09J 7/35* (2018.01)
*C09J 9/02* (2006.01)
*C09J 163/00* (2006.01)
*C09J 183/04* (2006.01)
*H01L 23/00* (2006.01)
*H01L 27/146* (2006.01)

(52) U.S. Cl.
CPC . *C09J 2483/00* (2013.01); *H01L 2224/29191* (2013.01); *H01L 2224/2929* (2013.01); *H01L 2224/29339* (2013.01); *H01L 2224/83862* (2013.01)

(56) References Cited

U.S. PATENT DOCUMENTS

| | | |
|---|---|---|
| 6,815,262 B2 | 11/2004 | Hundt |
| 8,087,296 B2 | 1/2012 | Ueda |
| 2003/0122236 A1* | 7/2003 | Nam .................. H01L 24/31 |
| | | 257/E23.044 |
| 2008/0289749 A1 | 11/2008 | Charlton |
| 2013/0034324 A1 | 2/2013 | Laing |
| 2016/0137886 A1* | 5/2016 | Sekol .................. C09J 7/00 |
| | | 252/500 |

* cited by examiner

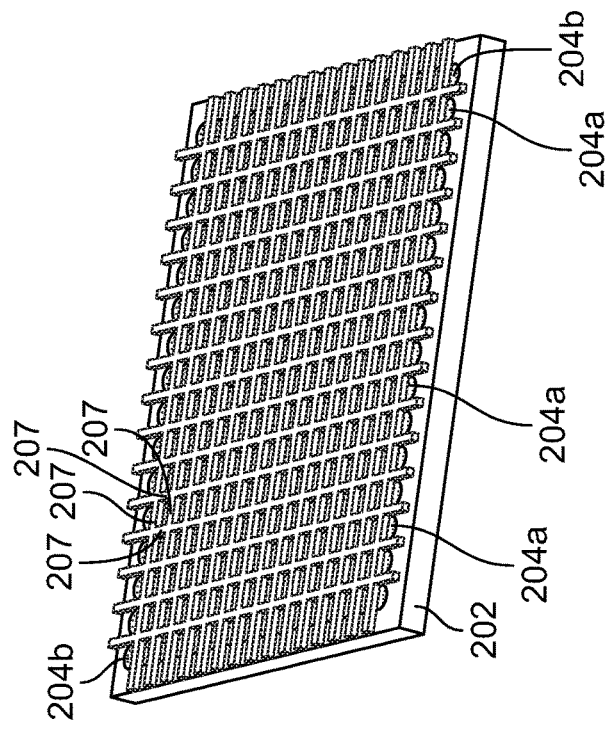
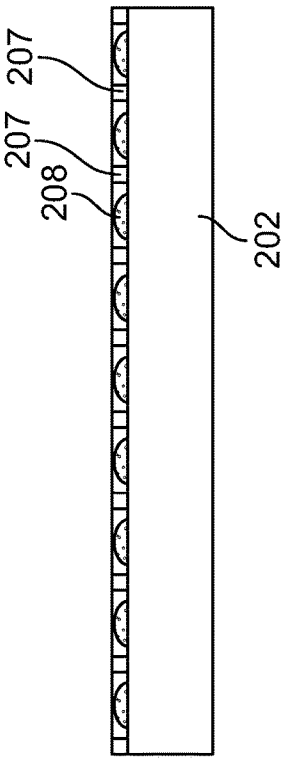
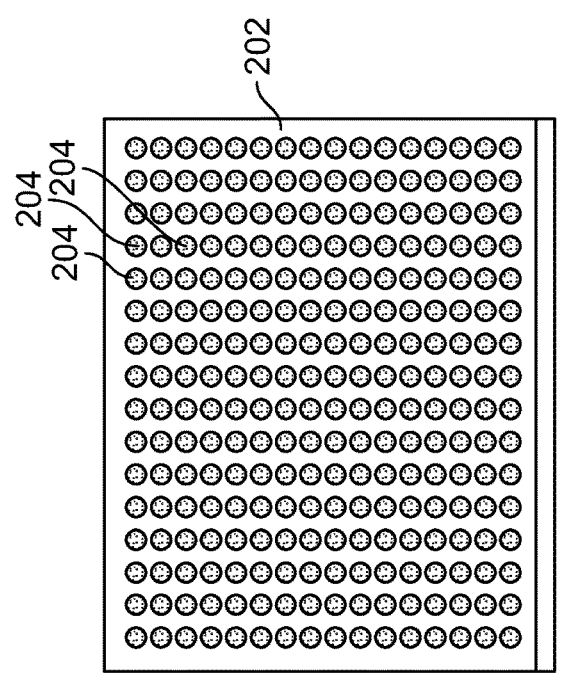
FIG. 2A
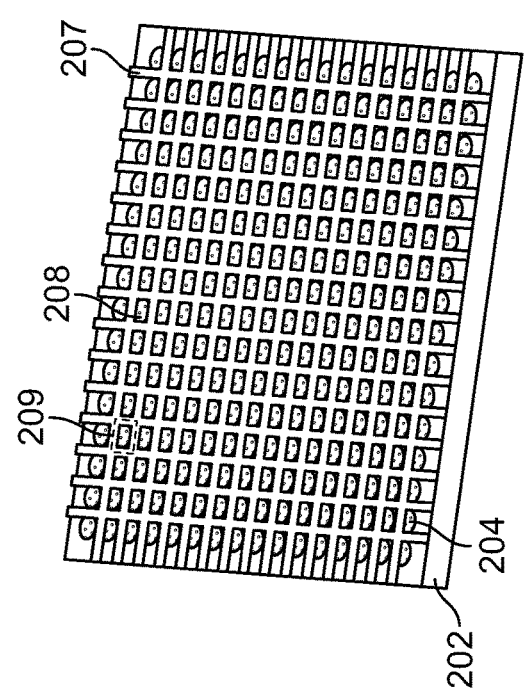
FIG. 2B
FIG. 2D
FIG. 2C

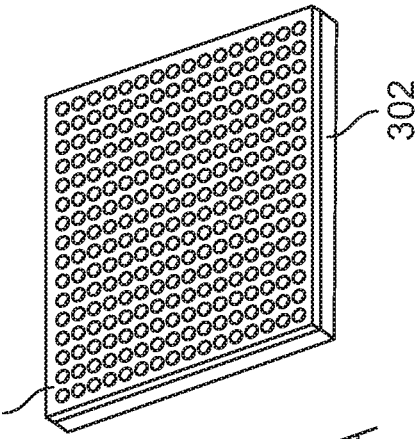
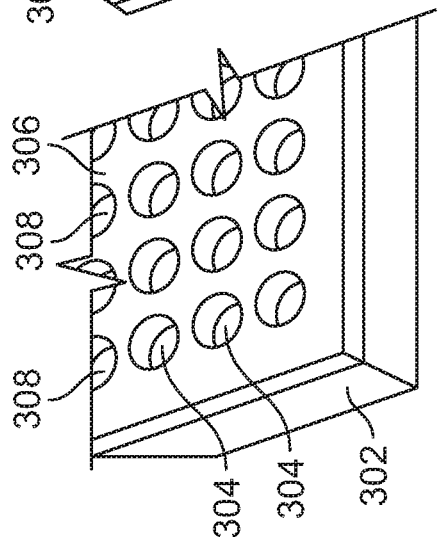
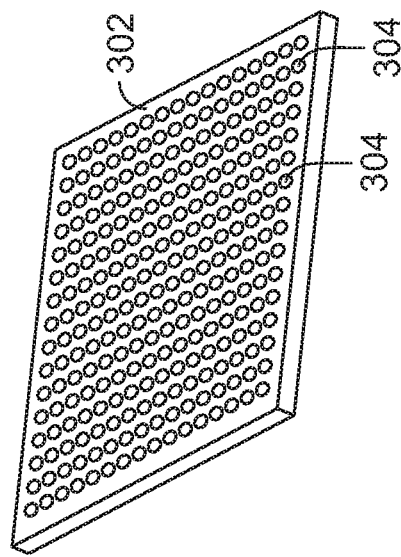
FIG. 3A
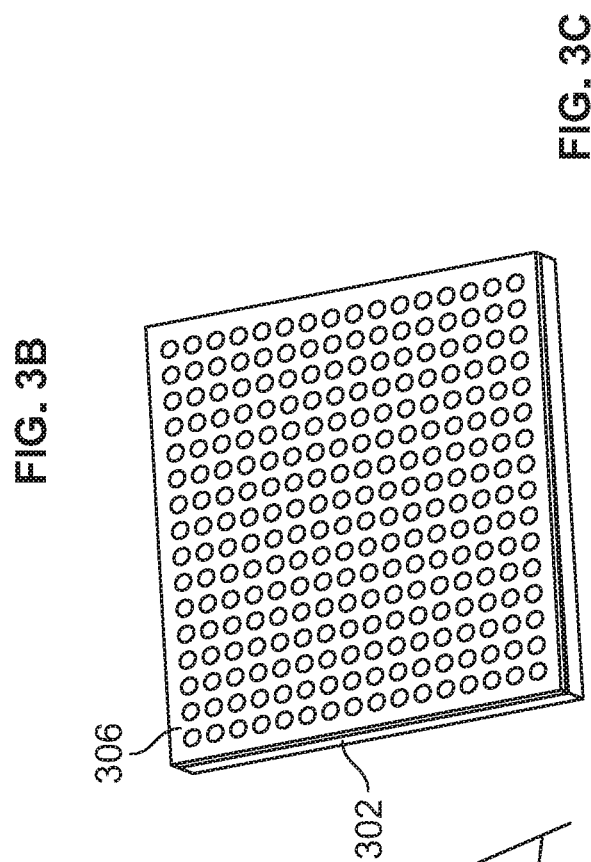
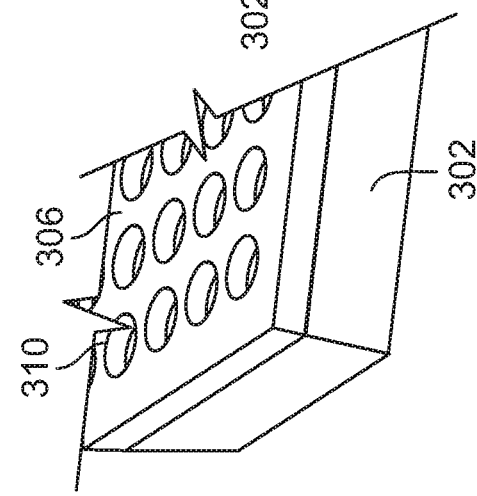
FIG. 3B
FIG. 3C

METHODS AND SYSTEMS FOR ATTACHING DETECTORS TO ELECTRONIC READOUT SUBSTRATES

FIELD

The present specification is related generally to the field of semiconductors. More specifically, the present specification is related to methods of, and detection systems comprising, improved approaches for attaching detectors to electronic readout substrates.

BACKGROUND

In order to obtain a readout of the signals captured by a detector, the detector is attached, connected, or otherwise coupled to an electronic substrate. Known methods of connecting detectors with electronic substrates use electrically conducting adhesive dots. The strength of the connection is solely dependent on the electrically conductive adhesive dots. Some problems faced when using such methods include 1) planarity problems caused by both gravity and the high viscosity of the conductive drops and 2) electrical shorting between pixels of the detector. Further, the mechanical strength of the connection may also be compromised, as the entire mechanical strain of the connection is borne by the conductive adhesive drops.

Hence, there is need for methods of and devices for attaching detectors to substrates that eliminate or minimize planarity issues. There is also a need for methods of and devices for attaching detectors to substrates that eliminate or minimize electrical shorting between detector pixels. There is also need for a low cost, high yield process for connecting detectors with substrates that also results in a detector capable of withstanding applied mechanical strain.

SUMMARY

The following embodiments and aspects thereof are described and illustrated in conjunction with systems, tools and methods, which are meant to be exemplary and illustrative, and not limiting in scope. The present application discloses numerous embodiments.

In some embodiments, the present specification discloses a method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising: positioning a non-conductive adhesive material over the first surface, wherein the non-conductive adhesive material is positioned between each of the plurality of electrically conducting pads such that the non-conductive adhesive material forms walls having a height extending above a surface of at least some of the plurality of electrically conducting pads; disposing conductive adhesive material onto each of the plurality of electrically conducting pads; and positioning a surface of the detector onto the first surface of the substrate and in physical communication with the conducting and non-conducting adhesives such that the surface of the detector contacts both the non-conductive adhesive material and the conductive adhesive material.

Optionally, a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

Optionally, the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

Optionally, the method further comprises positioning the first surface of the substrate above the surface of the detector to facilitate a gravity-induced flow of the conductive adhesive material toward the surface of the detector for a period of time ranging from five minutes to 48 hours, after positioning the surface of the detector onto the first surface of the substrate.

Optionally, the method further comprises subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

Optionally, non-conductive adhesive material comprises at least one of epoxy glue, silicone glue, or electrically insulated double sided tape.

Optionally, the conductive adhesive material comprises silver epoxy glue.

Optionally, the non-conductive adhesive material has a higher viscosity than the conductive adhesive material.

Optionally, the non-conductive adhesive material is adapted to provide electrical isolation between pixels of the detector.

Optionally, the height is at least 300 micrometers.

In some embodiments, the present specification discloses a detector assembly comprising: a substrate, wherein the substrate comprises at least a first surface with a plurality of electrically conducting pads protruding normal to the first surface and a plurality of spaces defined by edges of the plurality of electrically conducting pads and the first surface; a non-conductive adhesive material positioned on the first surface and in the plurality of spaces such that the non-conductive adhesive material form walls having a minimum height in a range of 50 micrometers to 300 micrometers positioned around the each of the plurality of electrically conducting pads; a first amount of conductive adhesive material positioned onto each of the plurality of electrically conducting pads, wherein the conductive adhesive material has a lower viscosity than the non-conductive adhesive material; and a detector, wherein a surface of the detector is positioned onto the first surface of the substrate and is in physical communication with both the conducting adhesive material and the non-conducting adhesive material.

Optionally, the detector positioned onto the first surface of the substrate is subjected to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period of time ranges from 10 minutes to 48 hours.

Optionally, the first amount is dependent upon a volume of an enclosure formed by the walls of the non-conductive adhesive material around each of the electrically conducting pads.

Optionally, the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

Optionally, the non-conductive adhesive material comprises at least one of epoxy glue, silicone glue, or electrically insulated double-sided tape.

Optionally, the conductive adhesive material comprises silver epoxy glue.

Optionally, the non-conductive adhesive material is adapted to provide electrical isolation between pixels of the detector.

In some embodiments, the present specification discloses a method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising: attaching a double sided non-conducting adhesive tape having a first thickness and openings cut into the first thickness on the first surface, wherein each of the plurality of electrical conducting pads are adapted to fit into each of the openings and wherein the non-conductive adhesive tape form dams around at least some of the plurality of electrically conductive pads; disposing conductive adhesive material onto each of the plurality of electrically conducting pads; and positioning a surface of the detector onto the first surface of the substrate and in physical communication with both the conductive adhesive material and the non-conducting adhesive tape.

Optionally, the openings are circular.

Optionally, a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

Optionally, the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

Optionally, the method further comprises positioning the first surface of the substrate above the surface of the detector to facilitate a gravity-induced flow of the conductive adhesive material toward the surface of the detector for a predefined period of time ranging from five minutes to 48 hours after positioning the surface of the detector onto the first surface of the substrate.

Optionally, the method further comprises subjecting the detector attached to the substrate to thermal curing for a predefined period in order to cure the conducting adhesive material, wherein the thermal curing comprises applying heat at a temperature ranging from 40 degrees Celsius to 90 degrees Celsius and wherein the predefined period ranges from 10 minutes to 48 hours.

Optionally, the conductive adhesive material comprises silver epoxy glue.

Optionally, the non-conductive adhesive material is adapted to provide electrical isolation between pixels of the detector.

Optionally, positioning the surface of the detector onto the first surface of the substrate and in physical communication with both the conducting adhesive material and the non-conducting adhesive material comprises placing the detector and the substrate in a mechanical jig.

The aforementioned and other embodiments of the present specification shall be described in greater depth in the drawings and detailed description provided below.

BRIEF DESCRIPTION OF THE DRAWINGS

These and other features and advantages of the present specification will be further appreciated, as they become better understood by reference to the following detailed description when considered in connection with the accompanying drawings:

FIG. 2A illustrates a substrate with electrical pads, in accordance with an embodiment of the present specification;

FIG. 2B illustrates a dam-like structure formed by a non-conducting adhesive on the substrate shown in FIG. 2A;

FIG. 2C illustrates the substrate of FIG. 2A with both non-conducting and conducting adhesives deposited thereon, in accordance with an embodiment of the present specification;

FIG. 2D illustrates a cross-sectional, side view profile of the substrate of FIG. 2C with both the non-conducting and conducting adhesives, in accordance with an embodiment of the present specification;

FIG. 3A illustrates a substrate with electrical pads, in accordance with an embodiment of the present specification;

FIG. 3B illustrates a dam-like structure formed by a non-conducting double-sided adhesive tape on the substrate shown in FIG. 3A; and FIG. 3C illustrates the substrate of FIG. 3A with non-conductive and conductive adhesives deposited thereon, in accordance with an embodiment of the present specification.

DETAILED DESCRIPTION

The present specification provides a method of connecting detector pads with substrates by using a non-conductive adhesive in conjunction with conductive adhesive drops. In various embodiments, the non-conductive adhesive is used for both providing electrical isolation between pixels of a detector pad and for imparting mechanical strength to the adhesion between the detector pad and a substrate. In embodiments, the electrically conductive adhesive drops provide an electrical connection between the detector pad and the substrate.

The present specification is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

In the description and claims of the application, each of the words "comprise" "include" and "have", and forms thereof, are not necessarily limited to members in a list with which the words may be associated. It should be noted herein that any feature or component described in association with a specific embodiment may be used and implemented with any other embodiment unless clearly indicated otherwise.

Figure 1:
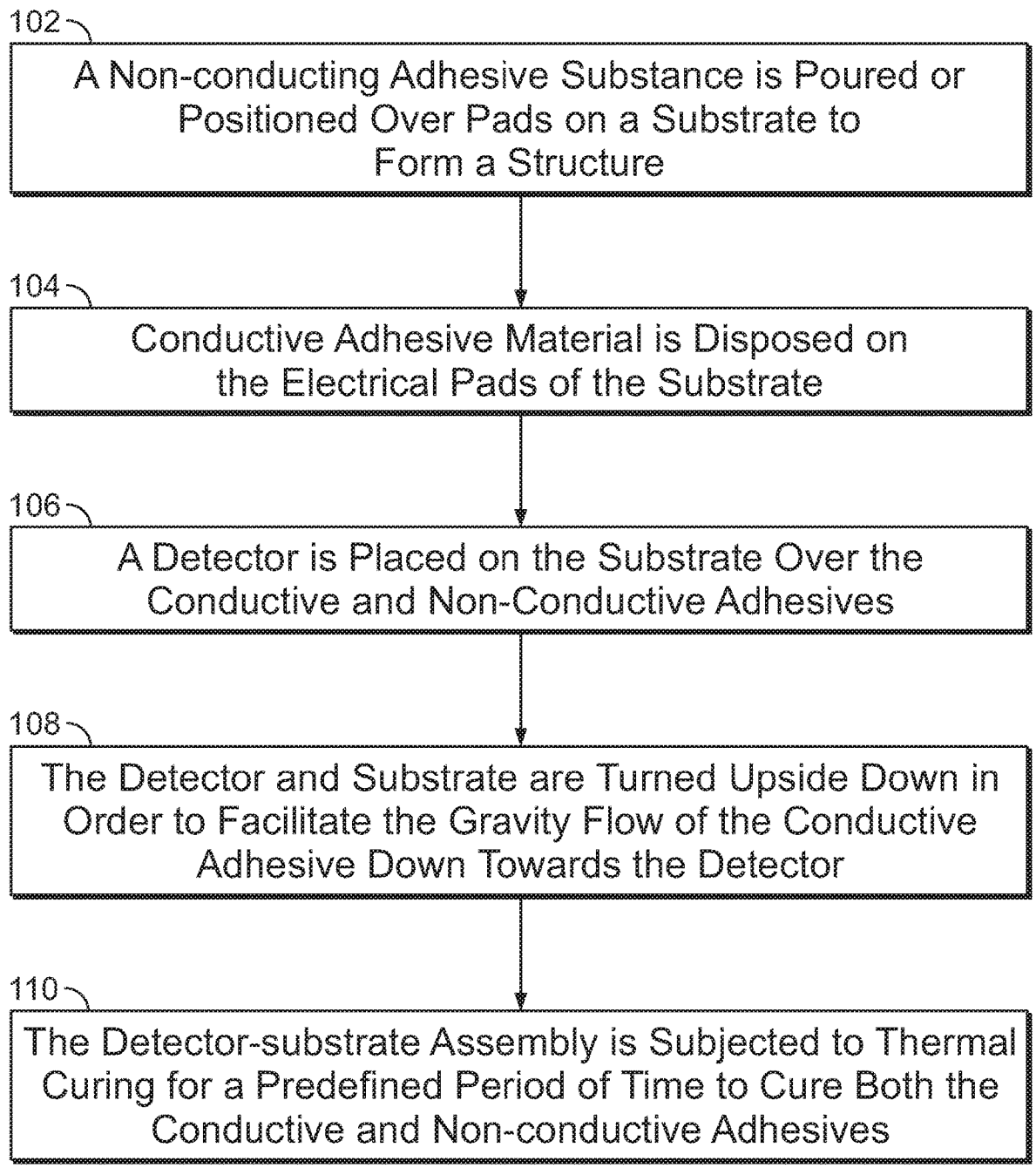
FIG. 1 is a flowchart illustrating the steps of connecting a detector pad with a substrate, in accordance with an embodiment of the present specification.

FIG. 1 is a flowchart illustrating the steps of connecting a detector pad with a substrate, in accordance with an embodiment of the present specification. In an embodiment, a substrate comprising electrical pads that is required to be connected to a detector is obtained. In an embodiment, the obtained substrate has the same size as the detector. In another embodiment, the substrate is larger than the detector. FIG. 2A illustrates a substrate with electrical pads, in accordance with an embodiment of the present specification. In embodiments, substrate 202 comprises a plurality of electrical pads 204 protruding above a surface of the substrate. In an embodiment, the electrical pads 204 are spaced apart from each other and from the edges of the substrate 202 by a distance of at least 0.2 mm. In an embodiment, the electrical pads 204 protrude or extend above the surface of the substrate by a distance ranging from 20 micrometers to 150 micrometers. In various embodiments, the substrate 202 may be any electronic substrate such as, but not limited to glass-reinforced epoxy laminate materials (FR4), Teflon®, or ceramics-based substrates.

FIG. 2B illustrates a dam-like structure formed by a non-conducting adhesive on the substrate shown in FIG. 2A. Referring to FIGS. 1, 2A and 2B, at step 102, a non-conducting adhesive substance such as, but not limited to, epoxy glue, silicone glue, electrically insulated double-sided tape (such as that supplied by 3M® or others) is applied on or near the periphery of a plurality of electrical pads 204 on the substrate 202, thus forming walls 207, which in turn, form dams 206 surrounding each electrical pad 204. Thus, each electrical pad 204 is housed within a non-conducting adhesive hollow area or channel or opening, approximating the dam-like structure 206. In various embodiments, it is preferable to surround each pad 204 with the dam-like structure 206 in order to eliminate the possibility of short circuits between the electrically conducting pads 204 and a conducting adhesive. In embodiments, the pads 204 located at the side edges of the substrate 202, such as pads 204a, are surrounded with the walls 207 on three sides as there is no adjacent pad located on a fourth/outer side, which obviates the possibility of a short circuit owing to the fourth side. In embodiments, the pads 204 located at the corners of the substrate 202, such as pads 204b, are surrounded with the walls 207 on two sides as there is no adjacent pad located on a third and fourth/outer side, which obviates the possibility of a short circuit owing to the third and fourth sides. In embodiments, each of the plurality of electrical pads 204 (except the edge pads 204a and corner pads 204b located at the edges and corners of the substrate 202, respectively and as discussed above) is surrounded on four sides by walls 207 of the dam-like structure 206, as is marked by a dashed line 209 in FIG. 2C.

In various embodiments, each of the four walls 207 of the dam structure 206 has a length/width of at least 50 μm (marked by a dashed line 209 in FIG. 2C). In various embodiments, the height of each of the walls 207 is at least 50 μm. In another embodiment, the minimum height of at least some of the walls 207 or all of the walls 207 is in a range of 50 μm to 500 μm, preferably in a range of 200 μm to 400 μm, and more preferably at least 300 μm. In an embodiment, where the non-conducting adhesive substance is epoxy glue, the substance is poured by using a dispenser. In an embodiment, when double-sided tape is used, the tape is glued around the pads to form a mesh with an opening over each pad. In various embodiments, individual dams are created around the electrical pads in order to eliminate the possibility of electrical shorts occurring between adjacent electrical pads. In an embodiment, adhesive dams are formed around the electrical pads located on the outer most edges of the substrate in order to protect said pads from outside contaminants.

At step 104, an amount of conductive, adhesive material is deposited on the electrical pads of the substrate. In various embodiments, the amount of conductive, adhesive material deposited on the electrical pads of the substrate is dependent upon the pad pitch and dam structure dimensions and may vary with substrate having different pad pitches and dam width and height. Accordingly, in one embodiment, an amount of conductive, adhesive material is first determined as a function of dam dimensions and the pitch of the pad being used. Once determined, the amount of the conductive adhesive material deposited onto each of the plurality of electrically conducting pads is dependent upon a volume of an enclosure formed by the walls of the non-conductive adhesive material around each of the electrically conducting pads. In an embodiment, wherein the volume of the enclosure formed by the walls of the non-conductive adhesive material around each of the electrically conducting pads is 0.3 mm×0.3 mm×0.3 mm (0.027 μL), the amount of the conductive adhesive material disposed onto each of the plurality of electrically conducting pads ranges from 0.3 mm×0.3 mm×0.15 mm (0.0135 μL) to 0.3 mm×0.3 mm×0.3 mm (0.027 μL).

In various embodiments, a conductive adhesive material is poured onto the electrical pads by using a pressure controlled dispenser that is operated to move predefined distances over a two dimensional space and pour a predefined quantity of the adhesive at defined points in the 2D space. In embodiments, the conductive adhesive material may include silver epoxy glue. In embodiments, the volume of an adhesive material drop over an electrical pad is approximately half of the volume of an insulating dam surrounding the electrical pad. Accordingly, in one embodiment, the amount of adhesive material is determined as a function of the insulating dam dimensions and, in one embodiment, the volume is approximately 25% to 75% of a volume defined by the insulating dam, 40% to 60% of the volume defined by the insulating dam, 45% to 55% of the volume defined by the insulating dam, or about 50% of the volume defined by the insulating dam.

FIG. 2C illustrates the substrate of FIG. 2A with non-conductive and conductive adhesives deposited thereon, in accordance with an embodiment of the present specification. As shown in the figure, conductive adhesive drops 208 placed on each of the plurality of electrical pads 204 on substrate 202 are surrounded by the non-conductive adhesive dams 206 (formed by walls 207). In various embodiments, the non-conductive adhesive forming the dam 206 has a higher viscosity than the conductive adhesive drops 208 depending upon the pad pitch and dimensions of the dam 206. In various embodiments, the higher viscosity of the insulating dam prevents any change in shape of the dam structure when the substrate is coupled with a detector, whereas the lower viscosity of the conductive drops enables the conductive material to be pulled by gravity when the substrate and detector are turned upside down, forming the connections between the substrate and detector stronger.

FIG. 2D illustrates a side-view cross-sectional profile of the substrate 202 with the non-conducting adhesive walls 207 and conducting adhesive drops 208, in accordance with an embodiment of the present specification.

Figure 2E:
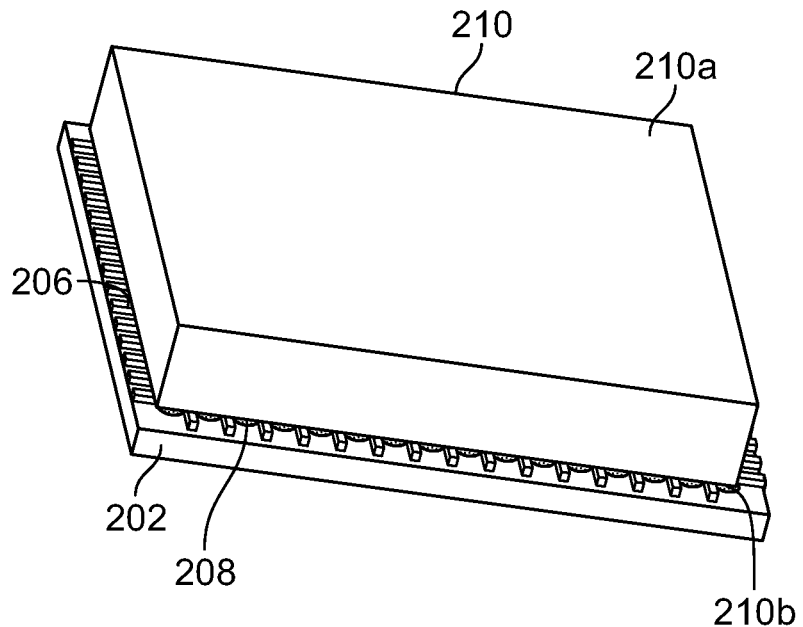
FIG. 2E illustrates a detector positioned over a substrate, in accordance with an embodiment of the present specification.
Figure 2F:
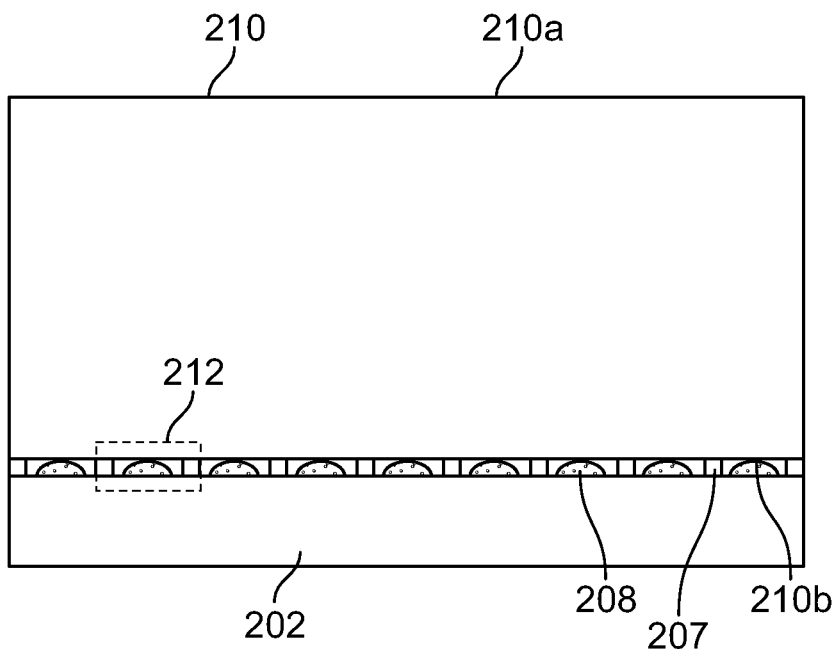
FIG. 2F illustrates a cross-sectional, side view profile of FIG. 2E, showing the detector in contact with the substrate, in accordance with an embodiment of the present specification.

Referring back to FIG. 1, at step 106, a detector, having a first side and a second side, is placed on the substrate over the conducting adhesive and non-conducting adhesive, such that a first side comes into contact with the adhesives. FIG. 2E illustrates a detector 210, having a first side 210a (top side) and a second side 210b (bottom side), wherein second side 210b is placed over the substrate, in accordance with an embodiment of the present specification. In an embodiment, second or bottom side 210b of the detector 210 is placed over, and onto, the substrate 202 using a mechanical jig. FIG. 2F illustrates a cross-sectional profile of the detector in contact with the substrate of FIG. 2E, in accordance with an embodiment of the present specification. Each area or channel 212 comprises a portion of the substrate 202, with an electrical pad 204 on the substrate 202, a conductive adhesive drop 208 placed on top of the electrical pad 204, and a portion of the bottom side 210b of the detector pad 210 resting on top of the conductive adhesive drop 208. As can be seen in FIG. 2F areas or channels 212 are surrounded by the non-conducting adhesive walls 207.

Figure 2G:
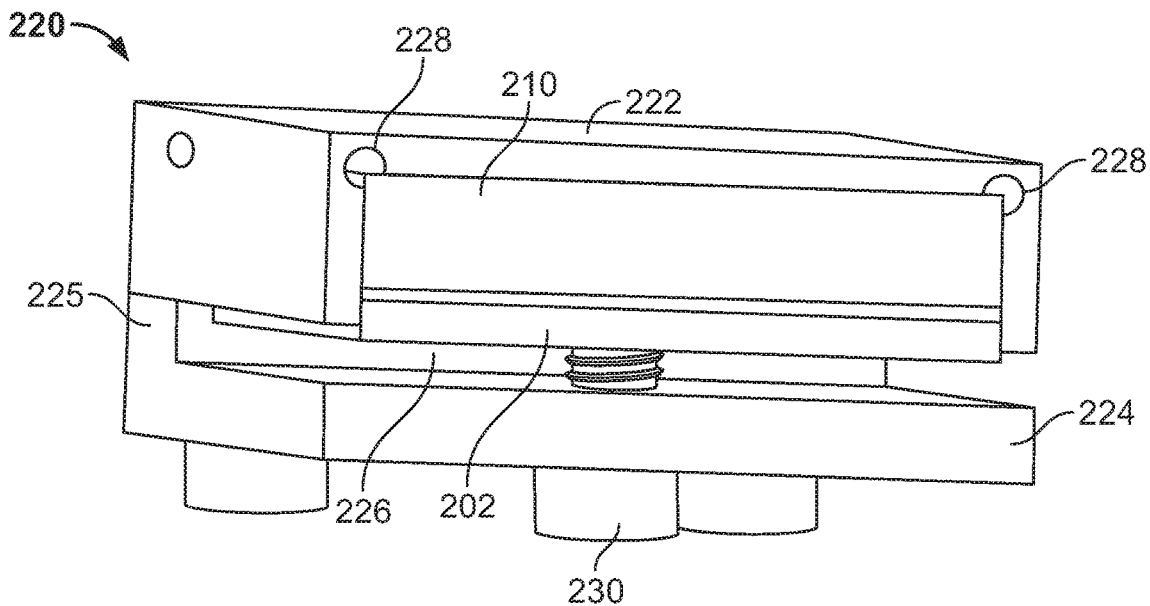
FIG. 2G illustrates a mechanical jig used for coupling the substrate and detector, having a top side facing upward, in accordance with an embodiment of the present specification.

FIG. 2G illustrates a mechanical jig used for coupling the substrate and detector, in accordance with an embodiment of the present specification. Mechanical jig 220 comprises a top portion 222 and a bottom portion 224, wherein the bottom portion approximates an "L" and is connected to top portion 222 via a protrusion or lip 225 on bottom portion 224, forming a gap 226 therebetween for placement of the detector-substrate structure described with respect to FIGS. 2E and 2F. The structure comprising the detector 210 placed over the substrate 202 is placed within the gap 226 of the mechanical jig 220. Holes 228 are provided on the top corners of the jig 220 as shown in FIG. 2G to prevent any damage to the structure while placed in the jig 220. The holes 228 are, in an embodiment, necessary to prevent detector edges from cracking or breaking as it is not always possible to form 90 degree angles between walls due to machining restrictions and holes are required to effectively enable machining. A screw 230 is provided on the bottom portion 224, which when tightened, presses the substrate 202 up against the detector 210.

Figure 2H:
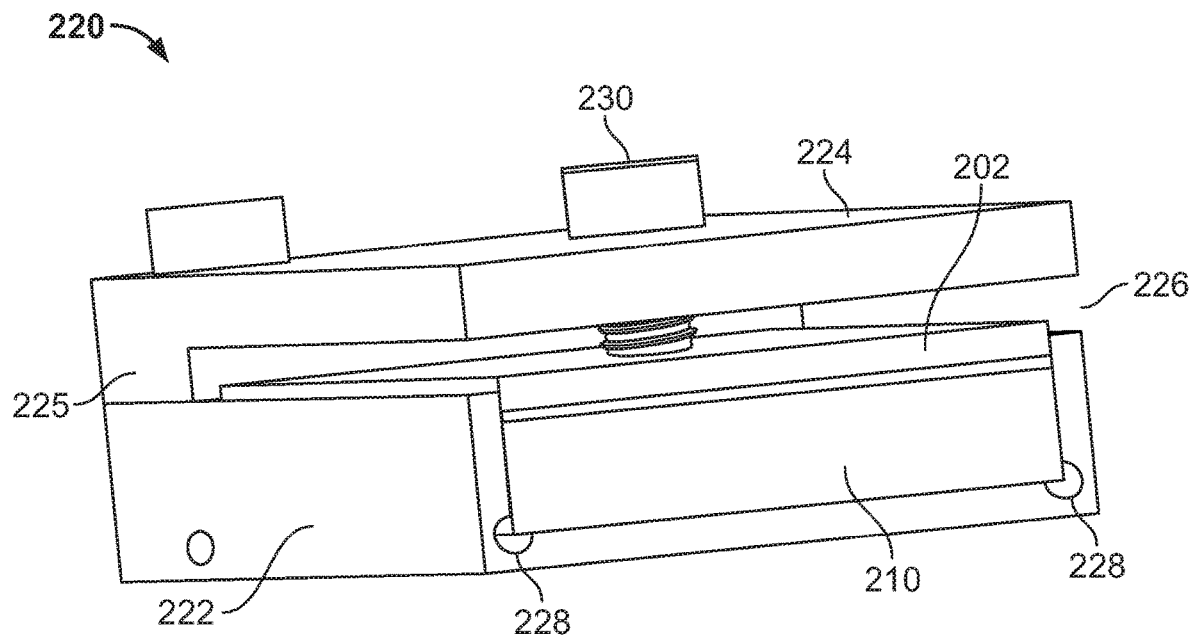
FIG. 2H illustrates the mechanical jig of FIG. 2G in rotated position with a top side facing downward, in accordance with an embodiment of the present specification.

Referring back to FIG. 1, at step 108, the detector and substrate are turned or flipped upside down, thereby placing the substrate above the detector, in order to facilitate the conductive adhesive to be pulled down towards the detector via gravity. FIG. 2H illustrates the mechanical jig of FIG. 2G in an upside down position, with the bottom portion facing upward in accordance with an embodiment of the present specification. Once the screw 230 is tightened as required, pressing the substrate 202 firmly up against the detector 210, the jig 220 is rotated so as to turn the substrate-detector structure upside down.

At step 110, the detector-substrate assembly is subjected to thermal curing by, for example, placing the assembly in an oven for a predefined period of time to cure both the conducting and non-conducting adhesives. In an embodiment, the curing time ranges from 30 minutes to 6 hours depending upon the type of adhesive conductor employed. In an embodiment, the thermal curing comprises applying heat at a temperature ranging from 40 degrees Celsius to 90 degrees Celsius for a predefined time period ranging from 10 minutes to 48 hours. In an embodiment, before transferring said assembly to the oven, the detector attached to the substrate is maintained in a mechanical jig for a predefined period of time ranging from five minutes to 48 hours, depending upon the type of adhesive conductor employed.

In an alternate embodiment, as explained above, a double-sided tape may be used as a non-conductive adhesive material to form walls and thus dams around each of the plurality of the electrical pads of a substrate. FIGS. 3A, 3B, and 3C illustrate insulating dams created by using a double-sided adhesive tape around a plurality of electrical pads of a substrate and providing conductive dots on said electrical pads. FIG. 3A illustrates a substrate 302 comprising a plurality of electrical pads 304 protruding above a surface of the substrate, in accordance with an embodiment of the present specification. It should be noted that the curing and baking time is the same in this embodiment. Thus, thermal curing time ranges from 30 minutes to 6 hours, and more specifically for a time period ranging from 10 minutes to 48 hours at a temperature ranging from 40 degrees Celsius to 90 degrees Celsius.

FIG. 3B illustrates a dam-like structure formed by a non-conducting double-sided adhesive tape on the substrate shown in FIG. 3A. Double-sided adhesive tape 306 is adhered to the surface of the substrate 302, via glue or other affixing means, leaving openings 308, preferably circular, for surrounding the plurality of electrical pads 304, as shown in FIG. 3B. Adhesive tape 306 is preferably fabricated from a non-conductive material and thus, forms insulating dams around the electrical pads 304 as required (and as described above with respect to FIGS. 2A through 2F). FIG. 3C illustrates the substrate of FIG. 3A with non-conductive and conductive adhesives deposited thereon, in accordance with an embodiment of the present specification. As shown in FIG. 3C, conductive adhesive drops 310 are deposited on the plurality of electrical pads 304 on the substrate 302. The plurality of electrical pads 304 are visible through the openings 308 in the tape 306 and are surrounded by the insulating tape forming dams around each electrical pad 304.

The above examples are merely illustrative of the many applications of the system of present specification. Although only a few embodiments of the present specification have been described herein, it should be understood that the present specification might be embodied in many other specific forms without departing from the spirit or scope of the specification. Therefore, the present examples and embodiments are to be considered as illustrative and not restrictive, and the specification may be modified within the scope of the appended claims.

We claim:

1. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:

positioning a non-conductive adhesive material over the first surface, wherein the non-conductive adhesive material is positioned between each of the plurality of electrically conducting pads such that the non-conductive adhesive material forms walls having a height extending above a surface of at least some of the plurality of electrically conducting pads, thereby forming an enclosure;

disposing a first amount of conductive adhesive material onto each of the plurality of electrically conducting pads, wherein the first amount is dependent upon a volume of the enclosure formed by the walls of the non-conductive adhesive material around each of the electrically conducting pads; and positioning a surface of the detector onto the first surface of the substrate and in physical communication with the conducting and non-conducting adhesives such that the surface of the detector contacts both the non-conductive adhesive material and the conductive adhesive material.

2. The method of claim 1 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

3. The method of claim 1 further comprising, after positioning the surface of the detector onto the first surface of the substrate, positioning the first surface of the substrate above the surface of the detector to facilitate a gravity-induced flow of the conductive adhesive material toward the surface of the detector for a period of time ranging from five minutes to 48 hours.

4. The method of claim 1 further comprising subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

5. The method of claim 1 wherein the non-conductive adhesive material comprises electrically insulated double sided tape.

6. The method of claim 1 wherein the conductive adhesive material comprises silver epoxy glue.

7. The method of claim 1 wherein the non-conductive adhesive material has a higher viscosity than the conductive adhesive material.

8. The method of claim 1 wherein the non-conductive adhesive material is adapted to provide electrical isolation between pixels of the detector.

9. The method of claim 1 wherein the height is at least 300 micrometers.

10. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:

attaching a double sided non-conducting adhesive tape having a first thickness and openings cut into the first thickness on the first surface, wherein each of the plurality of electrical conducting pads are adapted to fit into each of the openings and wherein the non-conductive adhesive tape form dams around at least some of the plurality of electrical conducting pads, thereby forming an enclosure;

disposing a first amount of conductive adhesive material onto each of the plurality of electrically conducting pads, wherein the first amount is dependent upon a volume of the enclosure formed by the walls of the non-conductive adhesive material around each of the electrically conducting pads; and positioning a surface of the detector onto the first surface of the substrate and in physical communication with both the conductive adhesive material and the non-conducting adhesive tape.

11. The method of claim 10, wherein the openings are circular.

12. The method of claim 10 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

13. The method of claim 10 further comprising, after positioning the surface of the detector onto the first surface of the substrate, positioning the first surface of the substrate above the surface of the detector to facilitate a gravity-induced flow of the conductive adhesive material toward the surface of the detector for a predefined period of time ranging from five minutes to 48 hours.

14. The method of claim 10 further comprising subjecting the detector attached to the substrate to thermal curing for a predefined period in order to cure the conducting adhesive material, wherein the thermal curing comprises applying heat at a temperature ranging from 40 degrees Celsius to 90 degrees Celsius and wherein the predefined period ranges from 10 minutes to 48 hours.

15. The method of claim 10 wherein the conductive adhesive material comprises silver epoxy glue.

16. The method of claim 10 wherein the non-conductive adhesive material is adapted to provide electrical isolation between pixels of the detector.

17. The method of claim 10 wherein positioning the surface of the detector onto the first surface of the substrate and in physical communication with both the conducting adhesive material and the non-conducting adhesive material comprises placing the detector and the substrate in a mechanical jig.

18. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:

positioning a non-conductive adhesive material over the first surface, wherein the non-conductive adhesive material is positioned between each of the plurality of electrically conducting pads such that the non-conductive adhesive material forms walls having a height extending above a surface of at least some of the plurality of electrically conducting pads;

disposing conductive adhesive material onto each of the plurality of electrically conducting pads;

positioning a surface of the detector onto the first surface of the substrate and in physical communication with the conducting and non-conducting adhesives such that the surface of the detector contacts both the non-conductive adhesive material and the conductive adhesive material; and positioning the first surface of the substrate above the surface of the detector to facilitate a gravity-induced flow of the conductive adhesive material toward the surface of the detector for a period of time ranging from five minutes to 48 hours.

19. The method of claim 18 wherein a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

20. The method of claim 19 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

21. The method of claim 18 further comprising subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

22. The method of claim 18 wherein the non-conductive adhesive material comprises electrically insulated double sided tape.

23. The method of claim 18 wherein the conductive adhesive material comprises silver epoxy glue.

24. The method of claim 18 wherein the non-conductive adhesive material has a higher viscosity than the conductive adhesive material.

25. The method of claim 18 wherein the non-conductive adhesive material is adapted to provide electrical isolation between pixels of the detector.

26. The method of claim 18 wherein the height is at least 300 micrometers.

27. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:

positioning a non-conductive adhesive material over the first surface, wherein the non-conductive adhesive material is positioned between each of the plurality of electrically conducting pads such that the non-conductive adhesive material forms walls having a height extending above a surface of at least some of the plurality of electrically conducting pads;

disposing conductive adhesive material onto each of the plurality of electrically conducting pads;

positioning a surface of the detector onto the first surface of the substrate and in physical communication with the conducting and non-conducting adhesives such that the surface of the detector contacts both the non-conductive adhesive material and the conductive adhesive material; and subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

28. The method of claim 27 wherein a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

29. The method of claim 28 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

30. The method of claim 27 further comprising, after positioning the surface of the detector onto the first surface of the substrate, positioning the first surface of the substrate above the surface of the detector to facilitate a gravity-induced flow of the conductive adhesive material toward the surface of the detector for a period of time ranging from five minutes to 48 hours.

31. The method of claim 27 wherein the non-conductive adhesive material comprises electrically insulated double sided tape.

32. The method of claim 27 wherein the conductive adhesive material comprises silver epoxy glue.

33. The method of claim 27 wherein the non-conductive adhesive material has a higher viscosity than the conductive adhesive material.

34. The method of claim 27 wherein the non-conductive adhesive material is adapted to provide electrical isolation between pixels of the detector.

35. The method of claim 27 wherein the height is at least 300 micrometers.

36. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:

positioning a non-conductive adhesive material over the first surface, wherein the non-conductive adhesive material is positioned between each of the plurality of electrically conducting pads such that the non-conductive adhesive material forms walls having a height extending above a surface of at least some of the plurality of electrically conducting pads;

disposing conductive adhesive material onto each of the plurality of electrically conducting pads; and positioning a surface of the detector onto the first surface of the substrate and in physical communication with the conducting and non-conducting adhesives such that the surface of the detector contacts both the non-conductive adhesive material and the conductive adhesive material, and wherein the non-conductive adhesive material has a higher viscosity than the conductive adhesive material.

37. The method of claim 36 wherein a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

38. The method of claim 37 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

39. The method of claim 36 further comprising, after positioning the surface of the detector onto the first surface of the substrate, positioning the first surface of the substrate above the surface of the detector to facilitate a gravity-induced flow of the conductive adhesive material toward the surface of the detector for a period of time ranging from five minutes to 48 hours.

40. The method of claim 36 further comprising subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

41. The method of claim 36 wherein the non-conductive adhesive material comprises electrically insulated double sided tape.

42. The method of claim 36 wherein the conductive adhesive material comprises silver epoxy glue.

43. The method of claim 36 wherein the non-conductive adhesive material is adapted to provide electrical isolation between pixels of the detector.

44. The method of claim 36 wherein the height is at least 300 micrometers.

45. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:
   attaching a double sided non-conducting adhesive tape having a first thickness and openings cut into the first thickness on the first surface, wherein each of the plurality of electrical conducting pads are adapted to fit into each of the openings and wherein the non-conductive adhesive tape form dams around at least some of the plurality of electrically conductive pads;
   disposing conductive adhesive material onto each of the plurality of electrically conducting pads;
   positioning a surface of the detector onto the first surface of the substrate and in physical communication with both the conductive adhesive material and the non-conducting adhesive tape; and
   positioning the first surface of the substrate above the surface of the detector to facilitate a gravity-induced flow of the conductive adhesive material toward the surface of the detector for a period of time ranging from five minutes to 48 hours.

46. The method of claim 45, wherein the openings are circular.

47. The method of claim 45, wherein a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

48. The method of claim 47 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

49. The method of claim 45 further comprising subjecting the detector attached to the substrate to thermal curing for a predefined period in order to cure the conducting adhesive material, wherein the thermal curing comprises applying heat at a temperature ranging from 40 degrees Celsius to 90 degrees Celsius and wherein the predefined period ranges from 10 minutes to 48 hours.

50. The method of claim 45 wherein the conductive adhesive material comprises silver epoxy glue.

51. The method of claim 45 wherein the non-conductive adhesive material is adapted to provide electrical isolation between pixels of the detector.

52. The method of claim 45 wherein positioning the surface of the detector onto the first surface of the substrate and in physical communication with both the conducting adhesive material and the non-conducting adhesive material comprises placing the detector and the substrate in a mechanical jig.

53. A method for attaching a detector to a substrate, wherein the substrate comprises at least a first surface with a plurality of electrically conducting pads protruding normal to the first surface and a plurality of spaces defined by edges of the plurality of electrically conducting pads and the first surface, the method comprising:
   attaching a double sided non-conducting adhesive tape having a first thickness and openings cut into the first thickness on the first surface, wherein each of the plurality of electrical conducting pads are adapted to fit into each of the openings and wherein the non-conductive adhesive tape form dams around at least some of the plurality of electrically conductive pads;
   disposing conductive adhesive material onto each of the plurality of electrically conducting pads;
   positioning a surface of the detector onto the first surface of the substrate and in physical communication with both the conductive adhesive material and the non-conducting adhesive tape; and
   subjecting the detector attached to the substrate to thermal curing for a predefined period in order to cure the conducting adhesive material and the non-conducting adhesive material, wherein the thermal curing comprises applying heat at a temperature ranging from 40 degrees Celsius to 90 degrees Celsius and wherein the predefined period ranges from 10 minutes to 48 hours.

54. The method of claim 53, wherein the openings are circular.

55. The method of claim 53, wherein a first amount of the conductive adhesive material is disposed onto each of the plurality of electrically conducting pads, wherein the first amount is dependent upon a volume of an enclosure formed by the walls of the non-conductive adhesive material around each of the electrically conducting pads.

56. The method of claim 55 wherein the volume of the enclosure formed by the walls of the non-conductive adhesive material around each of the electrically conducting pads is 0.3 mm×0.3 mm×0.3 mm, and wherein the first amount of the conductive adhesive material disposed onto each of the plurality of electrically conducting pad ranges from 0.3 mm×0.3 mm×0.15 mm to 0.3 mm×0.3 mm×0.3 mm.

57. The method of claim 53 further comprising, after positioning the surface of the detector onto the first surface of the substrate, positioning the first surface of the substrate above the surface of the detector to facilitate a gravity-induced flow of the conductive adhesive material toward the surface of the detector for a predefined period of time ranging from five minutes to 48 hours.

58. The method of claim 53 wherein the conductive adhesive material comprises silver epoxy glue.

59. The method of claim 53 wherein the non-conductive adhesive material is adapted to provide electrical isolation between pixels of the detector.

60. The method of claim 53 wherein positioning the surface of the detector onto the first surface of the substrate and in physical communication with both the conducting adhesive material and the non-conducting adhesive material comprises placing the detector and the substrate in a mechanical jig.

\* \* \* \* \*